United States Patent
Jorns et al.

(10) Patent No.: US 11,699,575 B2
(45) Date of Patent: Jul. 11, 2023

(54) MULTIPLE FREQUENCY ELECTRON CYCLOTRON RESONANCE THRUSTER

(71) Applicant: The Regents of the University of Michigan, Ann Arbor, MI (US)

(72) Inventors: Benjamin Alexander Jorns, Ann Arbor, MI (US); Benjamin Natan Wachs, San Francisco, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 76 days.

(21) Appl. No.: 17/023,095

(22) Filed: Sep. 16, 2020

(65) Prior Publication Data

US 2021/0082670 A1 Mar. 18, 2021

Related U.S. Application Data

(60) Provisional application No. 62/901,050, filed on Sep. 16, 2019.

(51) Int. Cl.
*H01J 37/32* (2006.01)

(52) U.S. Cl.
CPC ..... *H01J 37/32678* (2013.01); *H01J 37/3211* (2013.01); *H01J 37/32128* (2013.01); *H01J 37/32165* (2013.01); *H01J 37/32669* (2013.01)

(58) Field of Classification Search
None
See application file for complete search history.

(56) References Cited

U.S. PATENT DOCUMENTS

| | | | | | |
|---|---|---|---|---|---|
| 4,494,043 | A | * | 1/1985 | Stallings | H05H 1/04 315/111.41 |
| 4,952,273 | A | * | 8/1990 | Popov | H01J 37/32211 204/298.37 |
| 5,032,202 | A | * | 7/1991 | Tsai | H01J 37/32706 315/111.41 |
| 5,370,765 | A | * | 12/1994 | Dandl | H01J 37/32678 427/571 |
| 5,577,092 | A | * | 11/1996 | Kubiak | G21B 1/19 378/119 |

(Continued)

OTHER PUBLICATIONS

Baltz, E. A., Trask, E., Binderbauer, M., Dikovsky, M., Gota, H., Mendoza, R., Platt, J. C., and Riley, P. F., Achievement of Sustained Net Plasma Heating in a Fusion Experiment with the Optometrist Algorithm, Scientific Reports, vol. 7, No. 1, Dec. 2017.

(Continued)

*Primary Examiner* — Srinivas Sathiraju
(74) *Attorney, Agent, or Firm* — Lempia Summerfield Katz LLC

(57) ABSTRACT

An electron cyclotron resonance (ECR) thruster includes a magnetic field source configured to generate a magnetic field, a thruster body that defines a chamber, the thruster body being disposed relative to the magnetic field source such that the magnetic field is present in the chamber and such that a magnetic nozzle is established, an antenna configured to propagate radio frequency (RF) power within the chamber, and a waveform generator coupled to the antenna to generate an RF waveform for the RF power. The waveform generator is configured such that the RF waveform includes multiple frequencies.

20 Claims, 3 Drawing Sheets

(56) References Cited

U.S. PATENT DOCUMENTS

| | | | | |
|---|---|---|---|---|
| 5,859,428 | A | * | 1/1999 | Fruchtman ............... H05H 1/54 315/111.41 |
| 6,293,090 | B1 | * | 9/2001 | Olson ...................... H05H 1/54 315/111.71 |
| 6,414,438 | B1 | * | 7/2002 | Borisov ................. H05G 2/003 219/121.48 |
| 7,305,935 | B1 | * | 12/2007 | Foster ................... C23C 14/357 118/723 MA |
| 7,400,096 | B1 | * | 7/2008 | Foster ..................... H01J 27/18 315/111.41 |
| 7,493,869 | B1 | * | 2/2009 | Foster ..................... H01J 27/18 118/723 MA |
| 8,635,850 | B1 | * | 1/2014 | Light ...................... H01J 27/18 60/202 |
| 8,736,176 | B2 | * | 5/2014 | Pelletier ............. H01J 37/3266 118/723 MR |
| 9,123,508 | B2 | * | 9/2015 | Chistyakov ............. C23C 14/35 |
| 9,591,741 | B2 | * | 3/2017 | Larigaldie ................ H05H 1/54 |
| 10,340,122 | B2 | * | 7/2019 | Chen ................. H01J 37/32678 |
| 11,231,023 | B2 | * | 1/2022 | Siddiqui ................ B64G 1/402 |
| 2002/0168049 | A1 | * | 11/2002 | Schriever ............... B82Y 10/00 378/119 |
| 2007/0234705 | A1 | * | 10/2007 | Emsellem ............. F03H 1/0081 60/202 |
| 2008/0093506 | A1 | * | 4/2008 | Emsellem ............. F03H 1/0081 244/173.1 |
| 2009/0189083 | A1 | * | 7/2009 | Godyak .................. H01J 27/18 250/423 R |
| 2011/0005461 | A1 | * | 1/2011 | Vandermeulen ........ H01J 37/08 315/111.21 |
| 2013/0067883 | A1 | * | 3/2013 | Emsellem ............. F03H 1/0081 60/202 |
| 2015/0020502 | A1 | * | 1/2015 | Larigaldie ............. F03H 1/0081 60/202 |
| 2015/0342020 | A1 | * | 11/2015 | Hala ..................... H01J 37/244 315/5.13 |
| 2016/0200458 | A1 | * | 7/2016 | Longmier ............. F03H 1/0093 60/202 |
| 2016/0207642 | A1 | * | 7/2016 | Longmier ............. F03H 1/0081 |
| 2019/0107103 | A1 | * | 4/2019 | Siddiqui ............... F03H 1/0093 |
| 2019/0107104 | A1 | * | 4/2019 | Siddiqui ................ B64G 1/402 |
| 2021/0082670 | A1 | * | 3/2021 | Jorns ................. H01J 37/32669 |

OTHER PUBLICATIONS

Alton, G. D., "A New Method for Enhancing the Performances of Conventional B-Geometry ECR Ion Sources," vol. 749, AIP, 2005, pp. 103-107.

Alton, G. D., "Future prospects for ECR ion sources with improved charge state distributions," Tech, rep., Oak Ridge National Lab., TN (United States), 1995.

Aydil, E. S., Gregus, J. A., and Gottscho, R. A., "Multiple steady states in electron cyclotron resonance plasma reactors," Journal of Vacuum Sciences Technology A, vol. 11, No. 6, Nov. 1993, pp. 2883-2892.

Cannat, F., Lafleur, T., Jarrige, J., Chabert, P., Elias, P.-Q., and Packan, D., "Optimization of a coaxial electron cyclotron resonance plasma thruster with an analytical model," Physics of Plasmas, vol. 22, No. 5, May 2015, pp. 053503.

Celona, L., "Microwave Discharge Ion Sources," arXiv: 1411.0538 [physics], Nov. 2014, arXiv: 1411.0538.

Ebersohn, F., Girimaji, S., Staack, D., Shebalin, J., Longmier, B., and Olsen, C., "Magnetic Nozzle Plasma Plume: Review of Crucial Physical Phenomena," American Institute of Aeronautics and Astronautics, Jul. 2012.

Frazier, P. I., "A Tutorial on Bayesian Optimization," arXiv:1807. 02811 [cs, math, stat], Jul. 2018, arXiv: 1807.02811.

Gammino, S., Ciavola, G., Celona, L. G., Mascali, D., and Maimone, F., "Numerical Simulations of the ECR Heating With Waves of Different Frequency in Electron Cyclotron Resonance Ion Sources," IEEE Transactions on Plasma Science, vol. 36, No. 4, Aug. 2008, pp. 1552-1568.

Harle, T., Pottinger, S. J., and Lappas, V. J., "Helicon double layer thruster operation in a low magnetic field mode," Plasma Sources Science and Technology, vol. 22, No. 1, 2013, pp. 015015.

Hepner, S. T., Collard, T., and Jorns, B. A., "Low Frequency Wave Detection in the Plume of a Low Temperature Magnetic Nozzle," 2018 Joint Propulsion Conference, American Institute of Aeronautics and Astronautics.

J. A. Spencer, C. Kim, J.S. Kim, E. G. Evstatiev, V. Svidzinski, and B. Cluggish, (2014), "Modeling multiple-frequency electron cyclotron resonance heating", Review of Scientific Instruments 85, 02A914.

J. M. Sankovic, J. A. Hamley, and T. W. Haag, (1993), Performance Evaluation of the Russian SPT100 Thruster at NASA LeRC.

J. Sercel, (1993),"An Experimental and Theoretical Study of the ECR Plasma Engine", Dissertation by Joel Christophei Sercel.

K. Takahashi, C. Charles, R. Boswell, A. Ando, (2013), "Performance improvement of a permanent magnet helicon plasma thruster", J. Phys. Appl. Phys.

Kinder, R. L. and Kushner, M. J., "Consequences of mode structure on plasma properties in electron cyclotron resonance sources," Journal of Vacuum Science & Technology A: Vacuum, Surfaces, and Films, vol. 17, No. 5, 1999, pp. 2421-2430.

Kuninaka, H., and Satori, S., "Development and Demonstration of a Cathodeless Electron Cyclotron Resonance Ion Thruster," Journal of Propulsion And Power, vol. 14, No. 6, Nov.-Dec. 1998, pp. 1022-1026.

Kuninaka, H., Nishiyama, K., Funaki, I., Yamada, T., Shimizu, Y., and Kawaguchi, J., "Powered Flight of Electron Cyclotron Resonance Ion Engines on Hayabusa Explorer," Journal of Propulsion and Power, vol. 23, No. 3, May 2007, pp. 544-551.

Lafleur, T., Takahashi, K., Charles, C., and Boswell, R. W., "Direct thrust measurements and modelling of a radio-frequency expanding plasma thruster," Physics of Plasmas, vol. 18, No. 8, Aug. 2011, pp. 080701.

M. Brihoum, G. Cunge, M. Darnon, D. Gahan, O. Joubert, and N. S. J. Braithwaite, (2013), "Ion flux and ion distribution function measurements in synchronously pulsed inductively coupled plasmas", Journal of Vacuum Science & Technology A 31.

Maimone, F., Celona, L., Lang, R., Mader, J., Roßbach, J., Spädtke, P., and Tinschert, K., "Influence of frequency tuning and double-frequency heating on ions extracted from an electron cyclotron resonance ion source," Review of Scientific Instruments, vol. 82, No. 12, Dec. 2011, pp. 123302.

Mazouffre, S., "Electric propulsion for satellites and spacecraft: established technologies and novel approaches," Plasma Sources Science and Technology, vol. 25, No. 3, Jun. 2016, pp. 033002.

McDonald, M., "Preparations for Thrust Measurement and Error Discussion of the IMPULSE Resonant Microwave Cavity,".

Miller, D., Gibbons, E., and Gloersen, P "Cyclotron Resonance Propulsion System," Electric Propulsion Conference, American Institute of Aeronautics and Astronautics, Colorado Springs,CO,U.S A., Mar. 1963.

Olsen, C. S., Ballenger, M. G., Carter, M. D., Chang Diaz, F. R., Giambusso, M., Glover, T. W., Ilin, A. V., Squire, J. P., Longmier, B. W., Bering, E. A., and Cloutier, P. A., Investigation of Plasma Detachment From a Magnetic Nozzle in the Plume of the VX-200.

Rácz, R., Biri, S., Perduk, Z., Pálinkás, J., Mascali, D., Mazzaglia, M., Naselli, E., Torrisi, G., Castro, G., Cellona, L., Gammino, S., and Galata, A., "Effect of the two-close-frequency heating to the extracted ion beam and to the X-ray flux emitted by the ECR plasma," Journal of Instrumentation, vol. 13, No. 12, Dec. 2018, pp. C12012-C12012.

Samukawa, S., Ohtake, H., and Mieno, T., "Pulse-time-modulated electron cyclotron resonance plasma discharge for highly selective, highly anisotropic, and charge-free etching," Journal of Vac. Sci. and Tech. A 14 3049 (1996).

Skalyga, V., Izotov, I., Kalvas, T., Koivisto, H., Komppula, J., Kronholm, R., Laulainen, J., Mansfeld, D., and Tarvainen, D., "Suppression of cyclotron instability in Electron Cyclotron Resonance ion sources by two-frequency heating," Physics of Plasmas, vol. 22, No. 8, Aug. 2015, pp. 083509.

Vialis, T., "Development of an electron cyclotron resonance plasma thruster for satellites", Ph D. thesis, Sorbonne University, 2018.

(56) References Cited

OTHER PUBLICATIONS

Vialis, T., Jarrige, J., Aanesland, A., and Packan, D., "Direct Thrust Measurement of an Electron Cyclotron Resonance Plasma Thruster," Journal of Propulsion and Power, vol. 34, No. 5, 2018, pp. 1323-1333.

Vialis, T., Jarrige, J., and Packan, D., "Geometry optimization and effect of gas propellant in an electron cyclotron resonance plasma thruster," Atlanta, GA, Oct. 2017.

Vondrasek, R. C., Scott, R., and Pardo, R. C., "ECRIS operation with multiple frequencies," Rev. Sci. Instrum., pp. 5.

Williams, L. T. and Walker, M. L. R., "Thrust Measurements of a Radio Frequency Plasma Source," Journal of Propulsion and Power, vol. 29, No. 3, May 2013, pp. 520-527.

Xie, Z. Q. and Lyneis, C. M., "Improvements on the LBL AECR source," Proceedings: INS International Symposium, 24th, and 12th International Workshop on Electron Cyclotron Resonance (ECR) Ion Sources, Saitama, Japan, Apr. 25-27, 1995, 1995, pp. 24-28.

Yamamoto, N., Masui, H., Kataharada, H., Nakashima, H., and Takao, Y., "Antenna Configuration Effects on Thrust Performance of Miniature Microwave Discharge Ion Engine," Journal of Propulsion and Power, vol. 22, No. 4, Jul. 2006, pp. 925-928.

\* cited by examiner

MULTIPLE FREQUENCY ELECTRON CYCLOTRON RESONANCE THRUSTER

CROSS-REFERENCE TO RELATED APPLICATION

This application claims the benefit of U.S. provisional application entitled "Multiple Frequency Electron Cyclotron Resonance Thruster," filed Sep. 16, 2019, and assigned Ser. No. 62/901,050, the entire disclosure of which is hereby expressly incorporated by reference.

STATEMENT REGARDING FEDERALLY SPONSORED RESEARCH OR DEVELOPMENT

This invention was made with government support under Contract No. 80NSSC17K0157 awarded by the National Aeronautics and Space Administration. The government has certain rights in the invention.

BACKGROUND OF THE DISCLOSURE

Field of the Disclosure

The disclosure relates generally to electron cyclotron resonance (ECR) thrusters.

Brief Description of Related Technology

Low power magnetic nozzle thrusters promise several features that make them idea for small satellite applications. They offer simple operation, with only a single required power supply, and lack the often life-limiting neutralizer cathode that is required in most mature Electric Propulsion (EP) technologies. However, performance to date has typically been much lower than more established EP thruster designs, with low power thrust efficiency typically on the order of 1%.

Magnetic nozzle thruster designs using Electron Cyclotron Resonance (ECR) heating have shown great promise in overcoming the historically poor performance. Recent experiments have demonstrated thrust efficiency of over 10% at a specific impulse of 1000 seconds during a 50 W test, while previous experiments involving a Helicon-powered magnetic nozzle thruster, another form of magnetic nozzle, have typically seen efficiencies under 2% at these power levels.

Magnetic nozzle thrusters generate force by converting the random thermal energy of a plasma, typically generated by externally applied radiofrequency (RF) or microwave fields, to directed kinetic energy. In the case of ECR thrusters, heating is achieved when the frequency of the applied electromagnetic wave matches that of the natural electron cyclotron motion that occurs when a DC magnetic field is present within the plasma. Because the magnitude of the DC magnetic field is not constant in space, typical ECR discharges contain a single resonant surface over which the plasma absorbs most of its energy. The hot electrons generated through ECR are then expelled through an expanding magnetic nozzle, pulling the ions with them in an ambipolar diffusion process. Finally, the plasma must detach from the magnetic field lines in order to generate useful thrust.

Though there was some historical success operating these RF-based thrusters at kilowatt power levels, the bulky microwave sources of the time prohibited their use on satellites, and research on this topic declined sharply as gridded ion and Hall effect thrusters matured. While not suited for spaceflight at the time, ECR technologies have seen extensive use in both plasma processing reactors and as ion sources for particle accelerators.

Since the 1960s, the miniaturization of microwave sources has enabled ECR thrusters to once again become a viable technology for both medium and small scale satellites. More recently, ECR thrusters have been used as the ionization source for gridded ion thrusters in deep space missions.

Work on developing ECR powered gridded ion thrusters has yielded several new magnetic field designs and microwave antenna configurations. These new features have generated increased plasma density and reduced erosion rates in these thrusters, and have enabled their use in deep space missions. More recent research on an ECR magnetic nozzle thruster has shown that small geometric changes to the inner antenna and thruster walls can have profound impacts on performance.

SUMMARY OF THE DISCLOSURE

In accordance with one aspect of the disclosure, an electron cyclotron resonance (ECR) thruster includes a magnetic field source configured to generate a magnetic field, a thruster body that defines a chamber, the thruster body being disposed relative to the magnetic field source such that the magnetic field is present in the chamber and such that a magnetic nozzle is established, an antenna configured to propagate radio frequency (RF) power within the chamber, and a waveform generator coupled to the antenna to generate an RF waveform for the RF power. The waveform generator is configured such that the RF waveform comprises multiple frequencies.

In accordance with another aspect of the disclosure, an electron cyclotron resonance (ECR) thruster includes a magnetic field source configured to generate a magnetic field, a thruster body that defines a chamber, the thruster body being disposed relative to the magnetic field source such that the magnetic field is present in the chamber and such that a magnetic nozzle is established, an antenna configured to propagate radio frequency (RF) power within the chamber, and a waveform generator coupled to the antenna to generate an RF waveform for the RF power. The waveform generator is configured such that the RF waveform includes a first component at a first frequency and a second component at a second frequency. The first and second frequencies are offset from one another such that multiple resonance zones are established within the chamber In connection with the aforementioned aspect(s), the ECR thruster may alternatively or additionally include or involve any combination of one or more of the following aspects or features. The magnetic field source includes a plurality of permanent magnets. The plurality of permanent magnets are disposed forward of the chamber. The thruster body is axially adjacent to the plurality of permanent magnets. The waveform generator is configured such that the RF waveform comprises two frequencies. The two frequencies are offset by about 250 MHz. The two frequencies have a power ratio of about one. The antenna includes an antenna element disposed in the chamber. The waveform generator includes a plurality of oscillators, each oscillator of the plurality of oscillators being configured to generate a waveform component at a respective frequency of the multiple frequencies. The multiple frequencies fall in a range from about 1 kHz to about 2.5 GHz. The multiple frequencies fall in a range from about 800 MHz to about 2500 MHz. The thruster body defines a wall of the chamber. The thruster body includes a conductor disposed radially outward of the antenna, such that the RF power is propagated between antenna and the conductor. Each frequency of the multiple frequencies is configured to achieve electron heating within a respective zone of the chamber in accordance with a magnitude of the magnetic field in the zone. The magnetic field source configured such that the magnitude of the magnetic field varies spatially in the chamber.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
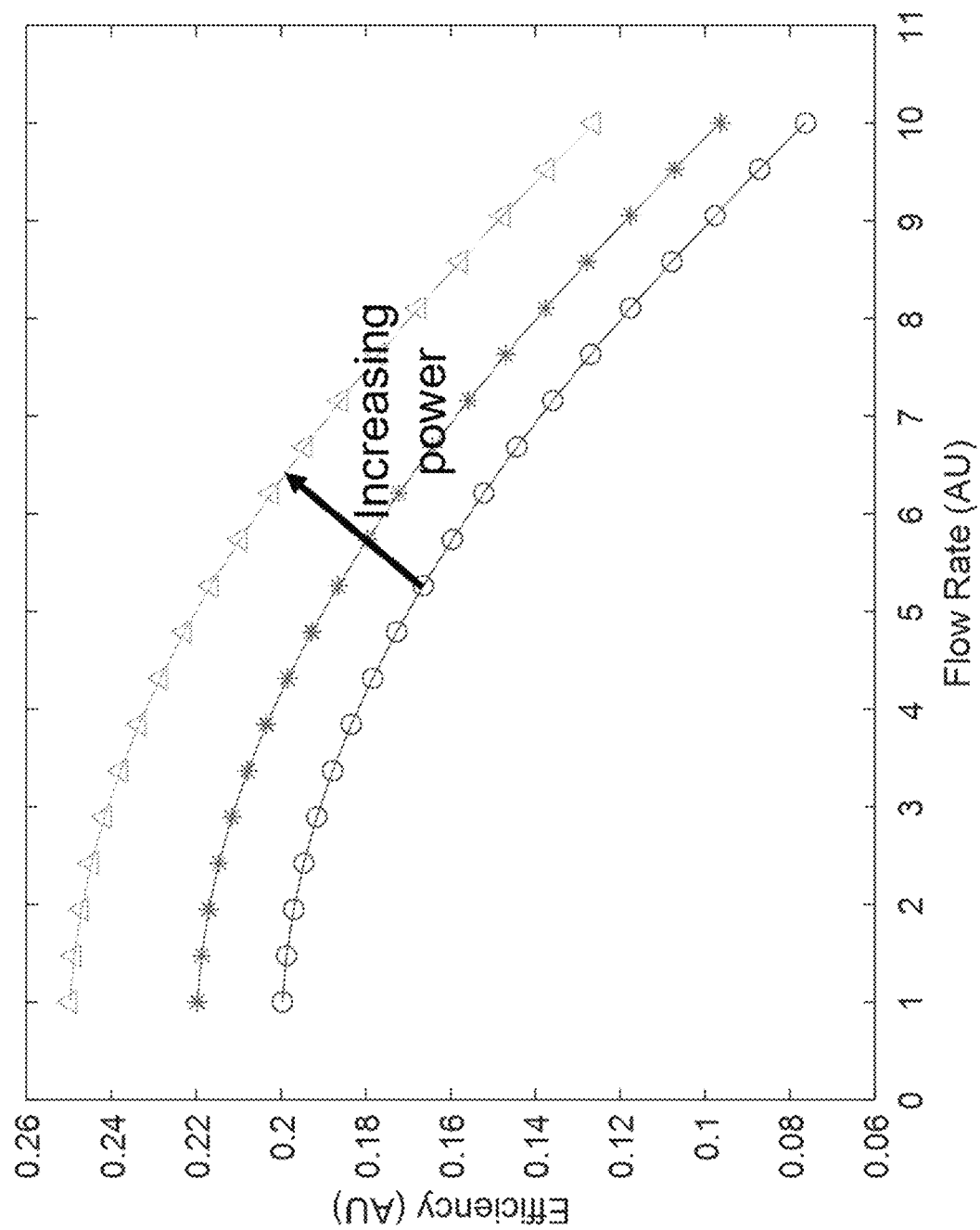
FIG. 1 is a graphical plot depicting a number of Pareto fronts generated via optimization at several operational set points.

The embodiments of the disclosed ECR thrusters may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

The disclosure generally relates to ECR thrusters having multiple frequency (e.g., two-frequency) heating. The use of multiple frequencies improves the performance of ECR magnetic nozzle thrusters. By focusing on the frequencies (and, in some cases, other characteristics) of the input waveform supplied to the plasma, the disclosed thrusters rely on design variables that do not require physical changes to be made to the thruster geometry. Avoiding physical changes between experiments or different operation conditions also enables rapid optimization, calibration, or other thruster set-up or configuration.

The input waveform may be or include a microwave or other RF waveform. In some cases, the input waveform may be configured in accordance pulsed power techniques used in plasma processing and multi-frequency heating in connection with ECR ion sources.

Figure 2:
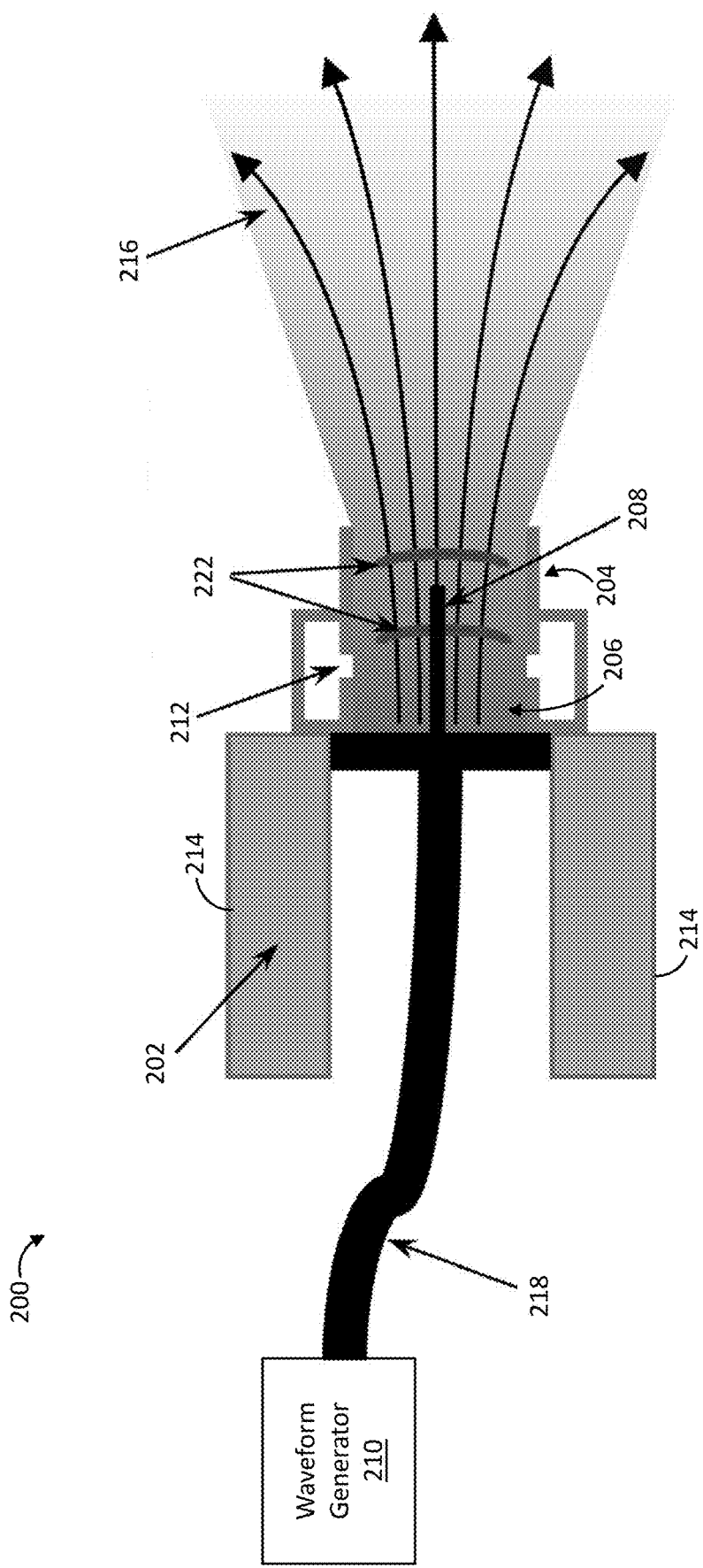
FIG. 2 is a schematic diagram of an ECR thruster configured for pulsed power or other multiple-frequency operation in accordance with one example.

Two-frequency (or other multiple frequency) heating adds or otherwise establishes a second (or multiple) resonance zone to the discharge, as shown in FIG. 2. The multiple frequencies effectively increase the volume over which the electrons are efficiently heated. The multiple frequencies may also lead to the formation of energetic electron energy tails. As a result, power coupling efficiency may be enhanced. This effect increases the density of hot electrons, which in turn leads to better ion source performance.

The addition of a second frequency has been shown to be useful in another ECR context lacking a magnetic nozzle and other aspects of thrusters, namely ECR ion sources. The addition of a second frequency was shown to dampen the discharge oscillations by suppressing kinetic instabilities typically present in ECR ion sources. The underlying experiments demonstrated just how sensitive ECR plasmas are to small changes in input waveform with changes of only a few MHz significantly modifying the output ion beam of a 14 GHz experiment. However, the disclosed thrusters present a significantly different operating regime than those of ECR ion sources. The disclosed thrusters are configured to operate at much lower frequencies (e.g., one or more orders of magnitude lower) and magnetic field strengths, as described herein.

In some cases, the multiple frequency heating provides pulsed power to a chamber of the ECR thruster in which resonance zones are generated. However, other types of multiple frequency waveforms may be used.

Although described in connection with an example involving a two-frequency waveform, the disclosed thrusters may use a variety of different multiple-frequency waveforms. The waveform may include any number of multiple, non-noise frequencies, such as a waveform with three frequency components for electron heating. The waveforms may be customized in additional or different ways. The waveform customization is not limited to use of multiple frequencies. A wide variety of variables may be tuned or otherwise configured when generating the input waveform, including, for instance, electron temperature, power ratio, frequency, duty cycle, modulation type, and bandwidth.

Turning to the drawing figures, FIG. 1 shows a number of Pareto fronts generated via optimization at several operational set points. Each Pareto front is representative of an optimal set of waveform and other operating parameters. Information provided by the Pareto fronts may allow the thruster to be operated more efficiently across a wide spectrum of operating conditions (e.g., mission-dependent operating conditions).

In one example, the waveform includes two independent frequencies, and the total input power is held constant. In such cases, three independent parameters may be varied, the first and second frequencies and the ratio of the power at each frequency. These input parameters may be tuned to address different total power and flow rate settings to find optimal operating conditions at alternate thrust levels and specific impulses. By optimizing at several set points, a Pareto front of optimal parameters may be generated, such as that shown in FIG. 1. This information allows the thruster to be operated more efficiently across a wider spectrum of mission-dependent operating conditions. Additional or alternative input parameters may be used. For instance, the duty cycle at each frequency may be used.

A Bayesian optimization solver and/or other optimization procedures may be used to determine the multiple frequencies, power ratio(s), and/or other parameters for a given operating condition scenario. For example, by independently controlling the two input frequencies and duty cycles, a four degree-of-freedom constrained optimization problem may be defined. The optimization may utilize alternative or additional optimization variables, such as the electron temperature, to achieve a desired set of waveform parameters (e.g., $f_1, \ldots, f_n$, and one or more power ratios).

FIG. 2 depicts an ECR thruster 200 that may be operated with multiple frequency heating in accordance with one example. The ECR thruster 200 includes a magnetic field source 202 configured to generate a magnetic field, a thruster body 204 that defines a chamber 206 in which multiple resonance zones are generated, an antenna 208 or other waveguide configured for propagation of radio frequency (RF) power within the chamber 206, and a waveform generator 210 coupled to the antenna 208 to generate an RF waveform for the RF power. As described herein, the waveform generator 210 is configured such that the RF waveform includes multiple (e.g., two) frequencies. Each frequency of the multiple frequencies is configured to achieve electron heating (e.g., ECR-based heating) within a respective zone of the chamber 206 in accordance with a magnitude of the magnetic field in the zone. The chamber 206 may accordingly be referred to as a resonance chamber. A wide variety of such multiple frequency waveforms (e.g., pulsed or non-pulsed) may be generated.

The thruster body 204 is disposed relative to the magnetic field source 202 such that the magnetic field is present in the chamber 206. The thruster body 204 may include or otherwise define one or more walls having ports, holes, or other openings 212 through which gas is injected. The walls define the chamber 206. The magnetic field source 202 may include a single magnet or a plurality of magnets (e.g., permanent magnets). In the example of FIG. 2, a pair of permanent magnets 214 of the magnetic field source 202 are disposed forward of the thruster body 204 and, thus, the chamber 206. In some cases, the thruster body 204 is axially adjacent to the pair of permanent magnets 214. The magnetic field source 202 may be configured such that the magnitude of the magnetic field in the chamber 206 varies spatially or positionally (e.g., across a plurality of zones).

The magnetic field source 202 is positioned relative to the chamber 206 such that a magnetic nozzle 216 is established for the thruster 200. Gas is ionized and heated using the microwave and/or other RF power. The magnetic nozzle 216 is configured such that plasma is expelled through an expanding magnetic field, thereby converting thermal energy into kinetic energy.

In the example of FIG. 2, the thruster body 204 and other components of the thruster 200 establish a coaxial antenna configuration or structure in which microwave power is injected from the back of the thruster 200 (i.e., in the direction anti-parallel to the thrust vector) between an inner antenna element of the antenna 208 and an outer conductor of the antenna 208. In this example, the inner antenna element is disposed in or at the chamber 206. The outer conductor serves as both a waveguide and as the walls of the plasma source. The outer conductor may thus be considered the thruster body 204 (or a part thereof) that defines the chamber 206. Other antenna configurations may be used, including, for instance, a waveguide coupled to a dielectric window.

ADC block 310 (FIG. 3) may be placed between an input coaxial cable 218 and the thruster 200 allowing the thruster body 204 to float with respect to the chamber 206. The thruster 200 may include alternative or additional conductors disposed radially outward of the inner antenna element of the antenna 208. Such conductors may or may not be part of the thruster body 204.

In one example, the magnetic field is generated by permanent NdFeB magnets. Alternative or additional types of permanent and non-permanent magnets may be used. For instance, the magnetic field may be generated around the chamber using different magnets and/or differently positioned magnets. In one example, the magnets generate a peak magnetic field of 1100 gauss inside the chamber 206. In the example of FIG. 2, gas is injected radially into the discharge region, however other gas injection arrangements may be used. For instance, an axial gas injection scheme may be alternatively or additionally used.

Xenon gas may be injected into the chamber 206. Alternative or additional gases may be used.

One or more aspects of the construction, configuration, components, and/or other characteristics of the thruster may vary from the example described above. For example, one or more components or other aspects of the thruster may be configured as described in U.S. Patent Publication No. 2016/0207642 ("Electrodeless plasma thruster"), U.S. Patent Publication No. 2016/0200458 ("Converging/diverging magnetic nozzle"), U.S. Patent Publication No. 2019/0107104 ("Electrothermal radio frequency thruster and components"), and U.S. Pat. No. 9,591,741 ("Plasma thruster and method for generating a plasma propulsion thrust"), the entire disclosures of which are hereby incorporated by reference. The multiple-frequency heating may be used with still other types of thrusters. For example, the thruster may be configured as described in Kuninaka et al., "Development and Demonstration of a Cathodeless Electron Cyclotron Resonance Ion Thruster," Journal of Propulsion and Power, Vol. 14, No. 6, pp. 1022-1026 (1998), the entire disclosure of which is hereby incorporated by reference.

Additional, fewer, or alternative components may be included in the thruster 200. For instance, the antenna 208 may not include an antenna element in the chamber. In some examples, the power may instead be delivered via a waveguide, the waveguide being coupled to a dielectric window through which the power is delivered. As another example, a DC block may not be included.

Figure 3:
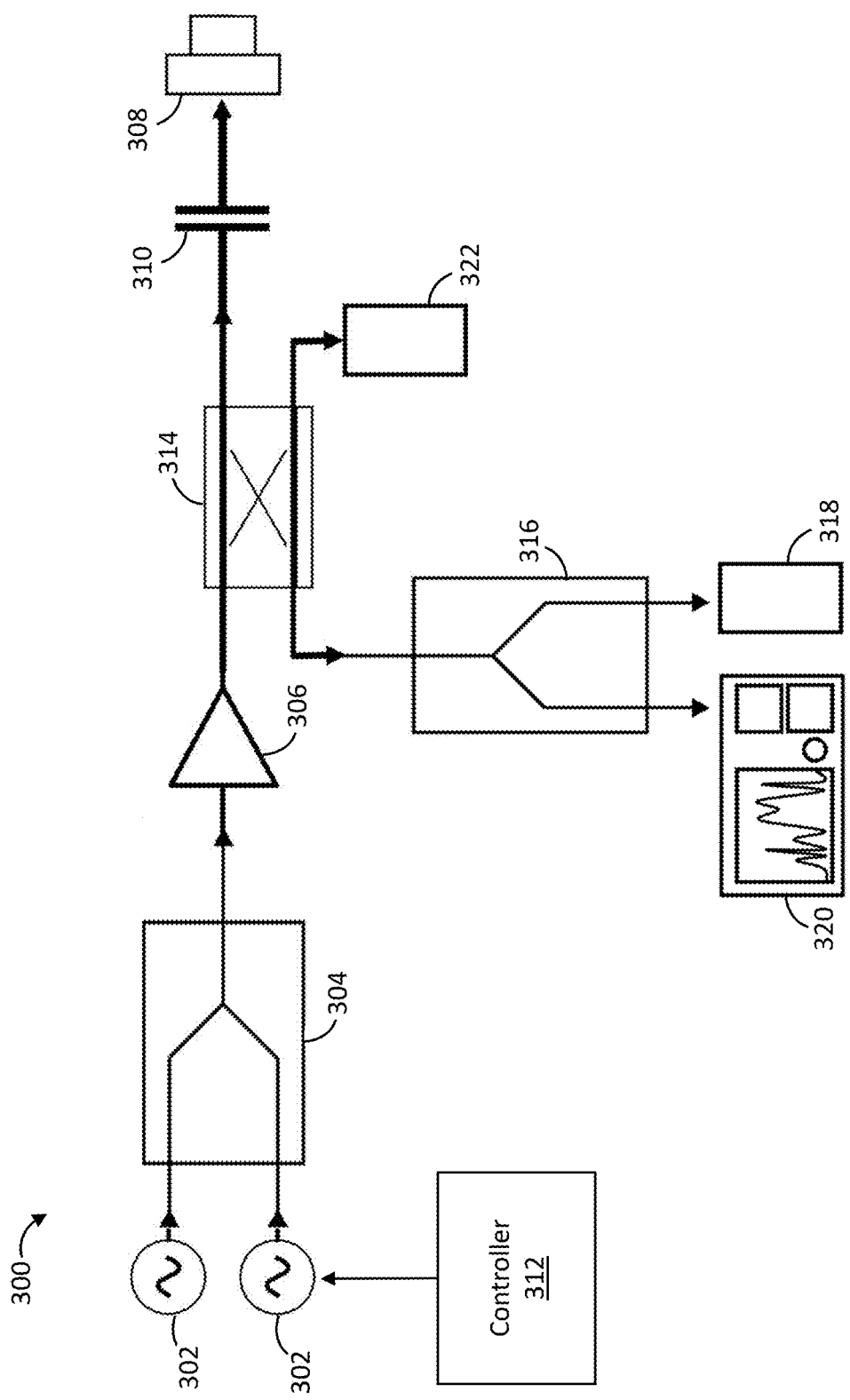
FIG. 3 is a schematic diagram of a waveform generator of the ECR thruster of FIG. 2 in accordance with one example.

FIG. 3 depicts one example of a waveform generator 300 in greater detail. In this example, the waveform generator includes signal sources 302 (e.g., oscillators) configured to generate microwave signals. In some cases, each oscillator 302 includes a voltage controlled oscillator (VCO), such as a Mini-Circuits oscillator. In one example, the oscillators 302 are configured to provide signals with multiple output frequencies, as described herein. In one example, the frequencies fall in a range from about 1,300 MHz to about 2,700 MHz, but other frequencies may be used. For instance, the frequencies may fall in a range from about 800 MHz to about 2500 MHz in another example. The signals from the oscillators 302 are then combined with a combiner 304, such as a Mini-Circuits ZX10-2-252-S+ combiner, and amplified using an amplifier 306, such as a Comtech PST or other linear amplifier. A wide variety of commercially available and other oscillators, combiners, and amplifiers may be used. The configuration, number, construction, and other characteristics of the oscillators 302 may vary accordingly (e.g., with the number of frequencies to be provided in the waveform).

The resulting waveform is then provided to a thruster, e.g., thruster antenna 308, via a DC block 310. The waveform may be carried by one or more coaxial cables, as described above. Additional, fewer, or alternative components may be included along the signal waveform path. For example, the power may be delivered via the cables or other waveguide to the chamber through a dielectric window. In such cases, an antenna element may not be present in the chamber.

The waveform generator 300 and/or the disclosed thruster 200 (FIG. 2) may include a controller 312 and/or other processor configured to control the waveform generator 300. For instance, the controller 312 may be configured to send one or more control signals (e.g., analog and/or digital voltage signals) to the oscillators 302 to adjust one or more characteristics of the waveform, such as the frequencies of the waveform. The control signals may be generated by the controller 312 in accordance with a desired operating condition of the thruster. For instance, the desired operating condition may specify a desired total power, flow rate, thrust level, and/or specific impulse to be achieved. The controller 312 may then be configured to take the data indicative of the desired operating condition and generate the control signals in accordance therewith.

The waveform generator 300 may include additional, fewer, or alternative elements. For instance, the number of oscillators may vary in accordance with the number of frequency components in the waveform. As an another example, one or more components directed to signal analysis may not be included, as described below.

FIG. 3 also depicts a number of components, including a coupler, used to analyze the waveform generated and measure the RF power delivered to the chamber. One or more of such components may not be included in some thruster examples. In some cases, diagnostics or measurement components may be included in the waveform generator 300. Such components may be included to provide feedback to the controller 312. In the example of FIG. 3, the power is sampled using a directional coupler 314, such as a Mini-Circuits ZABDC20-252H-N+ directional coupler, and the forward power is fed through a 3-dB splitter 316 after which one output is connected to a power sensor 318, such as a Mini-Circuits PWR-6RMS-RC true RMS power sensor, and the other is fed to a spectrum analyzer 320 (e.g., a HP 8563E spectrum analyzer). The reverse port of the directional coupler 314 is connected to a further power sensor 322 (e.g., a Mini-Circuits PWR-6 GHz power sensor) to measure reflected power. The inclusion, configuration and other characteristics of the above-described measurement components may vary.

The frequencies may fall in a wide range appropriate for ECR thrusters. In some cases, one or more (or all) of the frequencies fall within a frequency range from about 1 kHz to about 2.5 GHz. In other cases, a first frequency may fall in a range from about 1650 MHz to about 2500 MHz, while a second frequency may be about 250 MHz offset from the first frequency, either above or below. In other cases (e.g., with a different thruster design), the spread, or offset, between the two frequencies is greater. In such cases, one or more, or none, of the frequencies may fall outside of the range. Other frequencies may be used in other cases. In cases involving more than two frequencies, the offsets between respective pairs of adjacent frequencies may differ.

The magnetic field may have a strength that falls within a wide range appropriate for ECR thrusters. In some cases, the magnetic field strength falls within a range from about 100 Gauss to about 500 Gauss, but the magnetic field may vary in other cases.

Additional or alternative waveform parameters may also be varied as described herein. For instance, the power at each frequency may be varied independently of the power ratio or other relative power level. For instance, the waveform may be configured such that the power ratio (e.g., $P_1/P_2$) between two frequency components $f_1$ and $f_2$ is 1. The above-referenced optimization may be configured to achieve a wide variety of power ratios.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. An electron cyclotron resonance (ECR) thruster comprising:
a magnetic field source configured to generate a magnetic field;
a thruster body that defines a chamber, the thruster body being disposed relative to the magnetic field source such that the magnetic field is present in the chamber and such that a magnetic nozzle is established;
an antenna configured to propagate radio frequency (RF) power within the chamber; and
a waveform generator coupled to the antenna to generate an RF waveform for the RF power;
wherein the waveform generator is configured such that the RF waveform comprises multiple frequencies such that multiple resonance zones are established within the chamber to increase a volume of electron heating by the RF power.

2. The ECR thruster of claim 1, wherein the magnetic field source comprises a plurality of permanent magnets.

3. The ECR thruster of claim 2, wherein the plurality of permanent magnets are disposed forward of the chamber.

4. The ECR thruster of claim 2, wherein the thruster body is axially adjacent to the plurality of permanent magnets.

5. The ECR thruster of claim 1, wherein the waveform generator is configured such that the RF waveform comprises two frequencies.

6. The ECR thruster of claim 5, wherein the two frequencies are offset by 250 MHz.

7. The ECR thruster of claim 5, wherein the two frequencies have a power ratio of one.

8. The ECR thruster of claim 1, wherein the antenna comprises an antenna element disposed in the chamber.

9. The ECR thruster of claim 1, wherein the waveform generator comprises a plurality of oscillators, each oscillator of the plurality of oscillators being configured to generate a waveform component at a respective frequency of the multiple frequencies.

10. The ECR thruster of claim 1, wherein the multiple frequencies fall in a range from 1 kHz to 2.5 GHz.

11. The ECR thruster of claim 1, wherein the multiple frequencies fall in a range from 800 MHz to 2500 MHz.

12. The ECR thruster of claim 1, wherein the thruster body defines a wall of the chamber.

13. The ECR thruster of claim 1, wherein the thruster body comprises a conductor disposed radially outward of the antenna, such that the RF power is propagated between the antenna and the conductor.

14. The ECR thruster of claim 1, wherein each frequency of the multiple frequencies is configured to achieve electron heating within a respective zone of the chamber in accordance with a magnitude of the magnetic field in the zone.

15. The ECR thruster of claim 1, wherein the magnetic field source configured such that the magnitude of the magnetic field varies spatially in the chamber.

16. An electron cyclotron resonance (ECR) thruster comprising:
a magnetic field source configured to generate a magnetic field;
a thruster body that defines a chamber, the thruster body being disposed relative to the magnetic field source such that the magnetic field is present in the chamber and such that a magnetic nozzle is established;
an antenna configured to propagate radio frequency (RF) power within the chamber; and
a waveform generator coupled to the antenna to generate an RF waveform for the RF power;

wherein the waveform generator is configured such that the RF waveform comprises a first component at a first frequency and a second component at a second frequency, and wherein the first and second frequencies are offset from one another such that multiple resonance zones are established within the chamber to increase a volume of electron heating by the RF power.

17. The ECR thruster of claim 16, wherein the first and second frequencies fall in a range from 1 kHz to 2.5 GHz.

18. The ECR thruster of claim 16, wherein the first and second frequencies have a power ratio of one.

19. The ECR thruster of claim 16, wherein:
each frequency of the multiple frequencies is configured to achieve electron heating within a respective zone of the chamber in accordance with a magnitude of the magnetic field in the zone; and the magnetic field source configured such that the magnitude of the magnetic field varies spatially in the chamber.

20. The ECR thruster of claim 16, wherein the waveform generator is configured such that the RF waveform further comprises a third component at a third frequency offset from the first and second frequencies.

* * * * *